(12) United States Patent
Polcik et al.

(10) Patent No.: US 11,610,760 B2
(45) Date of Patent: Mar. 21, 2023

(54) VACUUM ARC SOURCE

(71) Applicant: Plansee Composite Materials GmbH, Lechbruck am See (DE)

(72) Inventors: Peter Polcik, Reutte (AT); Szilard Kolozsvari, Landsberg am Lech (DE); Igor Zhirkov, Linkoeping (SE); Johanna Rosen, Linkoeping (SE)

(73) Assignee: Plansee Composite Materials GmbH, Lechbruck am See (DE)

( * ) Notice: Subject to any disclaimer, the term of this patent is extended or adjusted under 35 U.S.C. 154(b) by 0 days.

(21) Appl. No.: 17/049,083

(22) PCT Filed: Mar. 13, 2019

(86) PCT No.: PCT/EP2019/056291
§ 371 (c)(1),
(2) Date: Oct. 20, 2020

(87) PCT Pub. No.: WO2019/201517
PCT Pub. Date: Oct. 24, 2019

(65) Prior Publication Data
US 2021/0257186 A1    Aug. 19, 2021

(30) Foreign Application Priority Data
Apr. 20, 2018   (EP) .................................... 18168526

(51) Int. Cl.
H01J 37/32      (2006.01)
C23C 14/06      (2006.01)
C23C 14/32      (2006.01)

(52) U.S. Cl.
CPC ...... *H01J 37/32055* (2013.01); *C23C 14/067* (2013.01); *C23C 14/325* (2013.01);
(Continued)

(58) Field of Classification Search
None
See application file for complete search history.

(56) References Cited

U.S. PATENT DOCUMENTS 4,430,184 A * 2/1984 Mularie ............ H01J 37/32055
                                                    204/192.38
4,536,640 A * 8/1985 Vukanovic .............. B05B 7/226
                                                    204/298.41
(Continued)

FOREIGN PATENT DOCUMENTS

CH           I411696 B     10/2013
CN         102947478 A      2/2013
(Continued)

OTHER PUBLICATIONS

O. Knotek et al.: "Ceramic cathodes for arc-physical vapour deposition: development and application", Surface and Coatings Technology, (1991), vol. 49, doi:doi:10.1016/0257-8972(91)90066-6, pp. 263-267, XP024500172.
(Continued)

*Primary Examiner* — Jason Berman
(74) *Attorney, Agent, or Firm* — Laurence A. Greenberg; Werner H. Stemer; Ralph E. Locher

(57) ABSTRACT

A vacuum arc source for arc evaporation of boride includes: a cathode made of at least 90 at-% of boride, in particular made of more than 98 at-% of boride; an anode, which is preferably in the shape of a disk; a body made of a material which is less preferred by arc discharge compared to the cathode, the body surrounding the cathode in such a way that during operation of the vacuum arc source, movement of an arc on an arc surface of the cathode is limited by the body. At least 90 at-% of the material of the anode is of the same chemical composition as the cathode.

17 Claims, 2 Drawing Sheets

(52) U.S. Cl.
CPC .... *H01J 37/3255* (2013.01); *H01J 37/32541* (2013.01); *H01J 2237/332* (2013.01)

(56) References Cited

U.S. PATENT DOCUMENTS

| | | | |
|---|---|---|---|
| 4,917,786 A * | 4/1990 | Ehrich | C23C 14/046 118/723 EB |
| 6,361,663 B1 | 3/2002 | Berthold et al. | |
| 6,495,002 B1 | 12/2002 | Klepper et al. | |
| 7,672,355 B1 * | 3/2010 | Holland | H01J 37/08 373/77 |
| 8,197,648 B2 | 6/2012 | Ramm et al. | |
| 9,481,925 B2 | 11/2016 | O'Sullivan | |
| 10,253,407 B2 | 4/2019 | Krassnitzer et al. | |
| 2007/0034501 A1 | 2/2007 | Bender | |
| 2008/0020138 A1 * | 1/2008 | Ramm | H01J 37/34 427/248.1 |
| 2013/0220800 A1 | 8/2013 | Lechthaler | |
| 2014/0076715 A1 * | 3/2014 | Gorokhovsky | C23C 14/32 204/192.12 |

FOREIGN PATENT DOCUMENTS

| | | |
|---|---|---|
| EP | 0577246 A1 | 1/1994 |
| JP | H0645870 B2 | 6/1994 |
| JP | H1068069 A | 3/1998 |
| TW | I411696 B | 10/2013 |
| WO | 2011137472 A1 | 11/2011 |

OTHER PUBLICATIONS

J. Treglio et al.: "Deposition of TiB2 at low temperature with low residual stress by a vacuum arc plasma source", Surface and Coatings Technology, (1993), vol. 61, doi:doi:10.1016/0257-8972(93)90245-J, pp. 315-319, XP025974358.

H. Fager et al.: "Thermal stability and mechanical properties of amorphous coatings in the Ti—B—Si—Al—N system grown by cathodic arc evaporation from TiB2, Ti33Al67, and Ti85 Si15 cathodes", J. Vac. Sci. Technol. A., (2014), vol. 32, No. 6, p. 061508.

I. Zhirkov et al.: "Vacuum arc plasma generation and thin film deposition from a TiB2 cathode", Applied Physics Letters, (2015), vol. 107, p. 184103.

\* cited by examiner

VACUUM ARC SOURCE

BACKGROUND OF THE INVENTION

Field of the Invention

The invention concerns a vacuum arc source for arc evaporation of boride and the use of such a vacuum arc source. The vacuum arc source has a cathode made of at least 90 at-% of boride, in particular made of more than 98 at-% of boride; an anode, which is preferably in the shape of a disk; a body made of a material which is less preferred by arc discharge compared to the cathode, the body surrounding the cathode in such a way that during operation of the vacuum arc source, movement of an arc on an arc surface of the cathode is limited by the body.

To date, there is no reproducible synthesis of Borides, in particular $TiB_2$, from arc evaporation, and from the reported few attempts on use of $TiB_2$-cathodes for thin film synthesis, extensive instability, cracking, and cathode failure can be concluded. In use of prior industrial arc sources, it is observed that cathode erosion is typically not uniform, with a high probability of sticking of the arc spot locally on the cathode surface with subsequent cathode destruction and termination of the deposition process after only minutes of operation (i. e. bad cathode utilization).

Deposition of $TiB_2$ films by the vacuum arc process at a $TiB_2$-cathode is not well described in literature. This is mainly limited to laboratory use, primarily due to challenges associated with materials synthesis such as extensive instability, cracking, and cathode failure (O. Knotek, F. Löffler, M. Böhmer, R. Breidenbach and C. Stöbel, "Ceramic cathodes for arc-physical vapour deposition: development and application," Surface and Coatings Technology, vol. 49, pp. 263-267, 1991).

Hypothetical routes for improving the process stability, such as applying a suitable magnetic field, or working in a reactive atmosphere (O. Knotek, F. Löffler, M. Böhmer, R. Breidenbach and C. Stöbel, "Ceramic cathodes for arc-physical vapour deposition: development and application," Surface and Coatings Technology, vol. 49, pp. 263-267, 1991), or through usage of a pulsed arc, have been suggested (J. Treglio, S. Trujillo and A. Perry, "Deposition of $TiB_2$ at low temperature with low residual stress by a vacuum arc plasma source," Surface and Coatings Technology, vol. 61, pp. 315-319, 1993).

These routes remain to be confirmed, although an improved arc process stability has been reported for use of a $TiB_2$-cathode in $N_2$ (H. Fager, J. Andersson, J. Jensen, J. Lu and L. Hultman, "Thermal stability and mechanical properties of amorphous coatings in the Ti—B—Si—Al—N system grown by cathodic arc evaporation from $TiB_2$, $Ti_{33}Al_{67}$, and $Ti_{85}Si_{15}$ cathodes," J. Vac. Sci. Technol. A., vol. 32, no. 6, p. 061508, 2014).

It has also been observed that removal of an external magnetic field seems to lead to dissipation of the arc spots and an increased active area of the cathode, with resulting reduced overheating and a somewhat stabilized plasma generation (I. Zhirkov, A. Petruhins, L.-A. Naslund, S. Kolozsvári, P. Polcik, and J. Rosen "Vacuum arc plasma generation and thin film deposition from a $TiB_2$ cathode", Applied Physics Letters 107, 184103 (2015)).

WO 2011/137472 A1 discloses a $TiB_2$ target which contains fractions of one or more metals from the group consisting of iron, nickel, cobalt and chromium and also carbon having specific mean grain size of the $TiB_2$ grains and carbon content.

Destructions of $TiB_2$-cathodes upon arcing is assumed to be caused by a relatively high thermal expansion coefficient. Local heating of the $TiB_2$-cathode by the arc spot leads to high stress, with resulting cracking, upon a temperature gradient.

SUMMARY OF THE INVENTION

The purpose of the invention is to provide a vacuum arc source for arc evaporation of Boride that can be used continuously or for longer periods of time than vacuum arc sources according to the prior art.

This is achieved by a vacuum arc source as claimed and use of such a vacuum arc source. Embodiments of the invention are defined in the dependent claims.

According to the invention there are provided:
- a cathode made of at least 90 at-% of Boride, in particular made of more than 98 at-% of Boride
- a body made of a material which is less preferred by arc discharge compared to the cathode, the body surrounding the cathode in such a way that during operation of the vacuum arc source, movement of an arc on an arc surface of the cathode is limited by the body
- an anode, which is preferably in the shape of a disk, at least 90 at-% of the material of the anode being of the same chemical composition as the cathode.

In an inventive vacuum arc source there are dissipated arc discharges (as no magnets need be used) leading to less current density and therefore less thermal shock decreasing risk of cracking of cathode. It is achieved that a coating produced using the inventive vacuum arc source is—at least substantially—free from impurities.

Placing the anode near the cathode results in intensive anode heating. Choosing an anode, the material of which is at least 90 at-% (preferably more than 99 at-%) of the same chemical composition as the cathode, cathode contamination of anode material, and resulting unintentional impurity incorporation during materials synthesis, is prevented.

Preferably, the cathode is made of $TiB_2$, $ZrB_2$, $VB_2$, $TaB_2$, $CrB_2$, $NbB_2$, $W_2B_5$ or $WB_2$, $HfB_2$, $AlB_2$, $MoB_2$, or $MoB$, or mixtures thereof.

Due to the striving of any physical process for the lowest cost of power, arc ignition on a cathode consisting of two or more regions of distinctly different elemental compositions, results in preferential arc glowing on the material which is able to provide the lowest glowing cathode potential, even if the initial arc was ignited on a material with higher potential. Therefore, the invention provides for ignition of the discharge at another material with subsequent movement of the arc spot to the Boride cathode. For this purpose, the cathode is surrounded by a body made of a material which is less preferred by arc discharge compared to the cathode.

In the present invention, destruction of the operational cathode surface is prevented by an increase in the active area of the arc spot and thereby an improved heat distribution. The invention increases the time a vacuum arc source for arc evaporation of Boride can be used by eliminating cathode destruction due to electrical and/or mechanical effects occurring during the ignition and/or operation of the arc.

By surrounding the cathode by a body made of a material which is less preferred by arc discharge the presence of arc spots at the cathode edges can be prevented thus increasing process stability. In the prior art a magnet is used for keeping the arc at the operational cathode surface. Without the magnet and without a body, arc spots start to go to the side of the cathode, where generated metallic flux can disrupt source insulators or the spot can die. Both these effects influence the process stability. The invention does not need the use of a magnet, in other words, during operation of the vacuum arc source, motion of the arc discharge is governed by electric field lines extending between cathode and anode and preferably there are no magnets guiding the arc discharge.

In the inventive vacuum arc source, designed to provide conditions for dissipation of the arc spots, stable plasma generation and consequently uniform cathode erosion, a magnet (which is typically used in prior sources), needs not be used. The absence of the magnet may lead to arc spots going to the edges of the cathode, where they die, and interrupt the deposition process. The here proposed body of a material of a higher cathode potential contains the arc in the operational area of the cathode surface limited by the cylinder edges. With no source magnet present, an increase in the strength of the electric field on sharp crystal grains on a Boride-cathode surface supports ignition of simultaneously operating arc spots of a lower spot current. This reduces the temperature gradient at the operational cathode surface and reduces the accompanying stress and a probability of cathode destruction.

As any physical process strives for the lowest cost of power, and as performed experiments show that the arc discharge glows at a cathode with a cathode-anode potential lower than 25 V, the material should provide a significantly higher potential. One such material is Molybdenum (Mo) with a potential around 30 V for the same conditions as used for, e. g., $TiB_2$. Comparing the resulting power (potential multiplied with the arc current), in this invention Mo or alloys thereof are preferably used as a material for the body surrounding the cathode. Other possible materials are Tungsten, Tantalum, Niobium, or alloys thereof, or electrically insulating ceramics based on $Al_2O_3$, $ZrO_2$, BN.

Preferably, a shape of the cathode is prismatic or cylindrical and/or a shape of the body is prismatic or cylindrical (having an opening for the cathode), wherein it is preferred that the shape of the cathode and the shape of the body are at least substantially the same. It should be understood, however, that the aforementioned shaped of the cathode can be modified in such a way that the cathode shows tapering towards the arc surface. A cylindrical shape of the cathode and a hollow-cylindrical shape of the body allow rotation of the cathode.

With respect to the radial arrangement of the body relative to the cathode, it is preferred that a maximum gap between cathode and body is below 1 Millimeter, preferably below 0.5 Millimeter. Although gaps of such small dimensions are acceptable it is preferred that the body abuts the cathode.

With respect to the axial arrangement of the body relative to the cathode there are different alternative possibilities:
the body might be arranged to protrude axially over the arc surface of the cathode
the cathode might be arranged to protrude axially over an end surface of the body
the arc surface of the cathode and an end surface body might be arranged to be coplanar With respect to a height of the body relative to a height of the cathode it is not necessary—although possible—that they are the same. It is sufficient if it is provided that the height of the body is at least 30% of the height of the cathode.

In a preferred embodiment, the anode—in a view onto the arc surface of the cathode—covers the end face of the body (with the possible exception of a slit for a trigger pin of an ignition system)—leaving an aperture allowing transport of a material flux from the arc surface of the cathode.

It is preferred that a minimal distance between
the cathode and the anode or
the body and the anode is between 0.5 Millimeter and 10 Millimeter, preferably between 1 Millimeter and 5 Millimeter.

The body surrounding the cathode not only prevents glowing of the arc at the cathode border, but also protect the operational cathode surface from electrical and mechanical damaging effects accompanying ignition of the arc. In many traditional industrial DC arc sources, the arc discharge is ignited by a pneumatic system based on a brief touch of the cathode surface by a trigger pin. The ignition current flowing through the trigger is typically in the range of tens of amperes, and the contact area is relatively small. As a result, arc ignition on a cathode according to the prior art tend to lead to a partial destruction of the surface around the trigger pin, eventually preventing the pin to touch the cathode and making ignition of the arc impossible.

In a preferred embodiment the trigger pin can be arranged to touch the body surrounding the cathode instead of the cathode itself (e. g. the length of the trigger pin can be adjusted). In this case a radial width of the body should be greater than a diameter of the trigger pin thus ensuring reliable ignition. The edge of the body then serves as the place for the arc ignition process (only if the material of the body is electrically conductive, this would not work e. g. with electrically insulating materials such as the beforementioned ceramics) with subsequent movement of the discharge to the cathode, where the arc preferentially glows. Tests by the applicant showed that erosion of the body is insignificant compared to the cathode. When using a body made of Molybdenum, diagnostics of plasma generated from the assembly and the resulting films showed no traces of Molybdenum.

In a recent publication (I. Zhirkov, A. Petruhins, L.-A. Naslund, S. Kolozsvári, P. Polcik, and J. Rosen "Vacuum arc plasma generation and thin film deposition from a $TiB_2$ cathode", Applied Physics Letters 107, 184103 (2015)), it was suggested that the crystalline structure with related surface features of a $TiB_2$ cathode induce dissipation of the arc spots (unless hindered by e. g. steering through a magnetic field), through an increase in strength of the electric field at the $TiB_2$ crystal grains, which improves the stability of the arc plasma generation. Similar increase in field strength can be achieved by reduction of the cathode-anode distance, by placing the system anode as close to the cathode surface as possible. The material flux from the cathode surface, for such configuration, is proposed to go through the anode aperture. However, a short cathode-anode distance results in evaporation of the anode. This may result in deposition of anode material onto the cathode surface, and unintentional incorporation of contaminations during materials synthesis. To avoid this, a cooling system for the anode can be utilized, however, in the invention this is not necessary since at least 90 at-% of the material of the anode is of the same chemical composition as the cathode.

Testing of the inventive cathode assembly demonstrated a much-improved stability compared to prior art source schemas. Further development is based on improved arc dissipation through an increase in the strength of the electric field at the cathode surface crystal grains. Any electrical discharge, as well as the here considering arc discharge, glows between at least two electrodes—cathode and anode (one of them can be virtual). The industrial arc sources typically have no separate anode, instead the chamber walls play the role of the anode, with a resulting typical large cathode-anode distance. Still, it is known, that the strength of the electrical field is determined by the anode-cathode distance. On the other hand, it is also known, that plasma shields the discharge electrodes from each another and almost all potential drop takes place near the cathode. In an embodiment of the invention, it is proposed, that a reduction of the cathode-anode distance will increase the density of the plasma in the cathode-anode gap and consequently facilitate ignition of the arc spot and enhance spot dissipation.

The vacuum arc source according to the invention can be uses for PVD deposition of thin-film-coatings, preferably for cutting and forming tools.

Test Results:

The proposed vacuum arc source has been successfully tested for a $TiB_2$-cathode. Every assembly part was tested separately as well as together. For all performed experiments an arc current equal to 100 Amp has been used in a chamber with operational pressure of $10^{-5}$ Torr.

For testing arc ignition by using a body in the form of a Mo cylinder and checking the possible presence of Mo in the resulting material flux from the arc source, a plasma analyzer EQP from Hiden LTD was placed at 35 cm from a $TiB_2$-cathode with a diameter of 59 mm surrounded by a Mo cylinder with an inner diameter of about 59 mm and an outer diameter of about 63 mm. Ignition was performed more than 10 times per minute for approximately 1 hour. It was found that ignition of the arc on Mo and subsequent movement to the $TiB_2$-cathode was assured for at least 90% of the attempts. Plasma diagnostics of the resulting material flux showed non-significant amount of Mo. The experiment also showed that with the body surrounding the $TiB_2$-cathode, there is no destruction of the cathode surface by the trigger pin. However, from time to time, the arc spot was still able to stick locally.

Using a $TiB_2$ disc as anode has also been tested separately, with plasma analysis performed with the analyzer at the distance of 35 cm. The anode disk thickness was 5 mm, the diameter was 150 mm. The aperture within the anode was 55 mm for the here used 63 mm cathode. The distance between the cathode and the anode in this experiment was set to 2 mm. For the trigger pin, there was a slit in the anode allowing ignition of the arc by the trigger pin. The performed experiment showed a positive influence of the presence of the anode on the stability of the arc discharge. Plasma diagnostics did not show changes in the plasma properties and/or composition of the generated flux as compared to plasma generated without an anode. However, experiments showed that in the absence of the Mo cylinder, the arc frequently died at the edges of the cathode.

A vacuum arc source consisting of the $TiB_2$-cathode, the Mo cylinder and the $TiB_2$ disc anode with a slit for arc ignition was also tested. The complete assembly showed a stable arc ignition process and smooth and stable arc plasma generation. Erosion of the operational cathode surface was found smooth and uniform. Sticking of the arc spot and an accompanying destruction of the cathode was not detected for the whole time of the experiment, about 2 hours. The performed plasma diagnostic of the generated material flux could be reproduced at different times during the experiment, or between different experiments performed under the same conditions.

The cathode-assembly according to the invention and/or a vacuum arc source according to the invention can be uses for PVD deposition of coatings for cutting and forming tools.

It is preferred that for a given shape of the cathode, a hollow shape of the body is chosen correspondingly, e. g. for a cylindrical cathode the body is in the shape of a hollow cylinder, for a conical cathode the body is in the shape of a hollow cone, for a prismatic cathode the body is in the shape of a hollow prism etc.

BRIEF DESCRIPTION OF THE SEVERAL VIEWS OF THE DRAWING

Embodiments of the invention are shown in the figures.

DETAILED DESCRIPTION OF THE INVENTION

Figure 1:
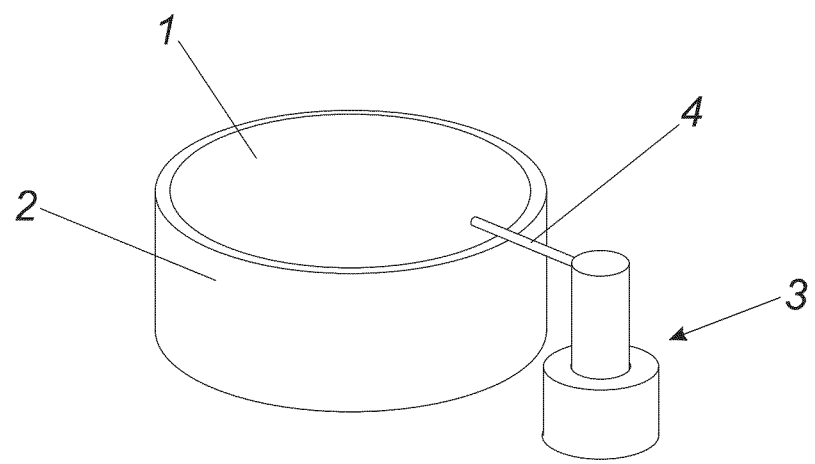
FIG. 1 an embodiment of an inventive cathode-assembly
FIG. 2 an embodiment of an inventive vacuum arc source
FIG. 3a-3i different possible configurations of cathode, body and anode

FIG. 1 shows a cathode-assembly for arc evaporation of $TiB_2$ with a cathode 1 made of $TiB_2$, the cathode 1 being surrounded by a body 2 made of a material (here: Mo) which is less preferred by arc discharge compared to the $TiB_2$-cathode 1. An ignition system 3 comprising a trigger pin 4 is shown.

Figure 2:
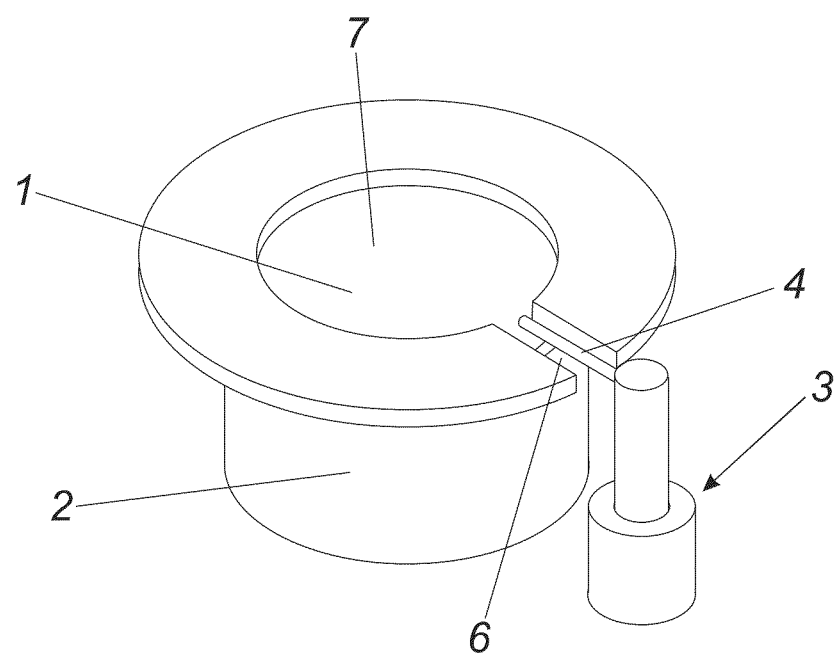

FIG. 2 shows a vacuum arc source for arc evaporation of $TiB_2$ using the cathode-assembly of FIG. 1. The body 2 in form of a Mo cylinder protects the cathode 1 from undesired effects accompanying ignition of the arc and, at the same time, it keeps the arc spot at the operational cathode surface.

The anode 5 has the shape of a disk with an aperture 7 for transport of the generated material flux to a substrate. It can also be noted that performed experiments showed that arc spots ignited below the anode 5 tend to go to the cathode area below the anode aperture.

The disk is provided with a slit 6 for the trigger pin 4 providing arc discharge ignition such that the trigger pin 4 can pass through the plane of the disk to touch the body 2.

Figure 3A:
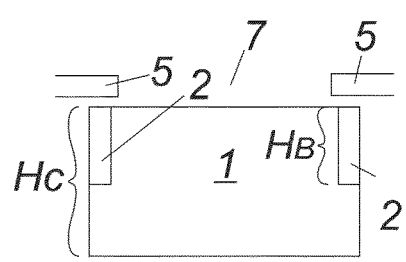
Figure 3B:
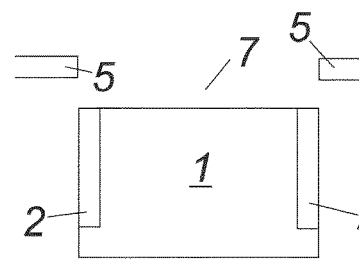
Figure 3C:
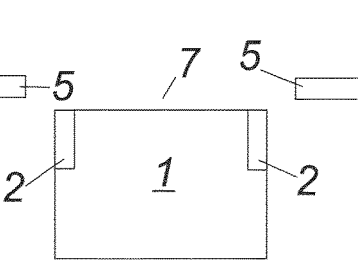
Figure 3D:
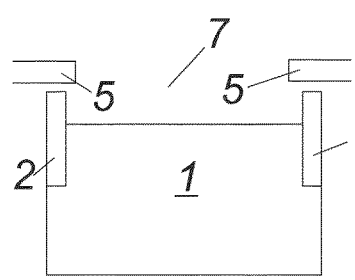
Figure 3E:
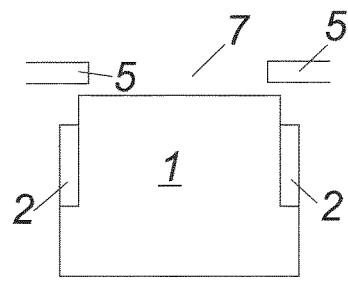
Figure 3F:
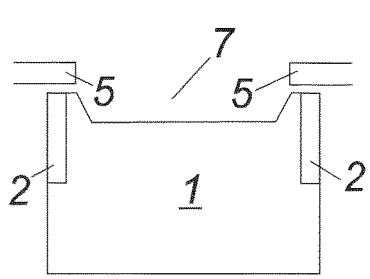
Figure 3G:
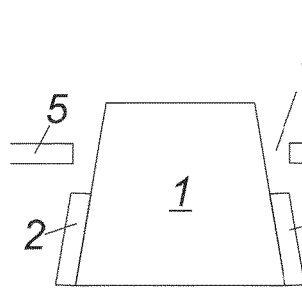
Figure 3H:
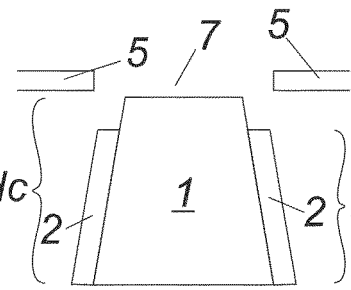
Figure 3I:
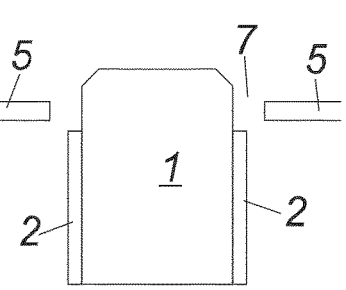

FIGS. 3a to 3i show different possible configurations of cathode 1, body 2 and anode 5. In all Figures, cathode 1, body 2 and anode 5 are in the form of rotating bodies: In FIGS. 3a to 3f, the cathode 1 is in the shape of a cylinder having a groove for the body 2 which is in the shape of a hollow cylinder. In FIGS. 3g and 3h, the cathode 1 is in the shape of a (truncated) cone and the body 2 is in the shape of a hollow (truncated) cone. In FIG. 3i the cathode 1 is in the shape of a cylinder which is tapering towards the arc surface. In FIGS. 3a to 3i the anode 5 is in the form of a ring.

In all Figures, a height $H_B$ of the body 2 is at least 30% of a height $H_C$ of the cathode 1.

In all Figures, the body 2 abuts a mantle surface of the cathode 1. However, a small gap between body 2 and cathode 1 below 1 Millimeter, preferably below 0.5 Millimeter would be acceptable.

In FIGS. 3a to 3c a top or end surface of the body 2 is coplanar with the arc surface of the cathode 1.

In FIG. 3d the body 2 protrudes over the arc surface of the cathode 1.

In FIGS. 3e and 3g to 3i the cathode 1 protrudes over the body 2.

In FIG. 3f the body 2 is coplanar with an outer rim of the arc surface of the cathode 1. In a radial direction towards the center an inner, central region of the arc surface of the cathode 1 lies below the outer rim of the arc surface of the cathode 1.

LIST OF REFERENCE SIGNS 1 cathode
2 body surrounding the cathode 3 ignition system
4 trigger pin
5 anode
6 slit in the anode
7 aperture of anode
$H_B$ height of body
$H_C$ height of cathode

The invention claimed is:

1. A vacuum arc source for arc evaporation, the vacuum arc source comprising:
   a cathode made of at least 90 at-% of boride;
   an anode;
   a body made of a material which is less preferred by arc discharge compared with said cathode, said body being disposed to abut said cathode and, during an operation of the vacuum arc source, to limit a movement of an arc on an arc surface of said cathode; and
   at least 90 at-% of a material of said anode being of a same chemical composition as said cathode;
   said body made of a material selected from the group consisting of molybdenum, tungsten, tantalum, niobium, an alloy of molybdenum, an alloy of tungsten, an alloy of tantalum, and an alloy of niobium;
   wherein said anode, in a view onto the arc surface of said cathode, covers an end face of said body, with an exception of a slit for a trigger pin of an ignition system, leaving an aperture allowing transport of a material flux from the arc surface of said cathode.

2. The vacuum arc source according to claim 1, wherein said cathode is made of more than 98 at-% of boride.

3. The vacuum arc source according to claim 1, wherein said anode is a disk-shaped anode.

4. The vacuum arc source according to claim 1, wherein said cathode is made of a material selected from the group consisting of $TiB_2$, $ZrB_2$, $VB_2$, $TaB_2$, $CrB_2$, $NbB_2$, $W_2B_5$, $WB_2$, $HfB_2$, $AlB_2$, $MoB_2$, $MoB$, and mixtures thereof.

5. The vacuum arc source according to claim 1, wherein a shape of said cathode is prismatic or cylindrical and/or a shape of said body is prismatic or cylindrical.

6. The vacuum arc source according to claim 5, wherein the shape of said cathode and the shape of said body are at least substantially equal.

7. The vacuum arc source according to claim 5, wherein said cathode tapers towards the arc surface.

8. The vacuum arc source according to claim 1, wherein one of the following is true:
   said body protrudes axially over the arc surface of said cathode;
   said cathode protrudes axially over an end surface of said body;
   the arc surface of said cathode and an end surface of said body are coplanar.

9. The vacuum arc source according to claim 1, wherein a height of said body is at least 30% of a height of said cathode.

10. The vacuum arc source according to claim 1, wherein more than 99 at-% of the material of said anode has the same chemical composition as the material of said cathode.

11. The vacuum arc source according to claim 1, Wherein a minimum distance between:
    said cathode and said anode, or
    said body and said anode;
    is 0.5 millimeters to 10 millimeters.

12. The vacuum arc source according to claim 1, further comprising an ignition system of the vacuum arc source having a trigger pin disposed to touch said body surrounding said cathode.

13. The vacuum arc source according to claim 12, wherein said body has a radial width greater than a diameter of said trigger pin, enabling reliable ignition.

14. The vacuum arc source according to claim 1, wherein, during an operation of the vacuum arc source, motion of an arc discharge is governed by electric field lines extending between said cathode and said anode.

15. The vacuum arc source according to claim 14, wherein no magnets are provided for guiding the arc discharge.

16. A deposition method, comprising:
    providing a vacuum arc source according to claim 1; and
    depositing a thin-film coating by physical vapor deposition onto a substrate.

17. The method according to claim 16, which comprises forming the thin-film coating of a cutting tool or a forming tool.

* * * * *